United States Patent [19]

Storer

[11] Patent Number: 5,413,851
[45] Date of Patent: May 9, 1995

[54] COATED FIBERS

[75] Inventor: Jonathan G. Storer, Inver Grove Heights, Minn.

[73] Assignee: Minnesota Mining and Manufacturing Company, St. Paul, Minn.

[21] Appl. No.: 487,587

[22] Filed: Mar. 2, 1990

[51] Int. Cl.⁶ ............................................. D02G 3/00
[52] U.S. Cl. .................... 428/361; 428/375; 428/379; 428/401; 501/95
[58] Field of Search ............ 428/389, 367, 379, 375, 428/361, 401, 549, 568, 569; 501/95

[56] References Cited

U.S. PATENT DOCUMENTS

| | | | |
|---|---|---|---|
| 3,175,922 | 3/1965 | Blocher, Jr. et al. | 427/6 |
| 3,625,848 | 12/1971 | Snaper | 204/192 |
| 3,823,029 | 7/1974 | Rashid | 427/112 |
| 3,836,451 | 9/1974 | Snaper | 204/298 |
| 4,278,728 | 7/1981 | Honda et al. | 428/315 |
| 4,343,836 | 8/1982 | Newkirk et al. | 427/249 |
| 4,379,111 | 4/1983 | Smith et al. | 428/389 |
| 4,581,289 | 4/1986 | Dietrich et al. | 428/379 |
| 4,642,271 | 2/1987 | Rice | 428/378 |
| 4,649,060 | 3/1987 | Ishikawa et al. | 427/57 |
| 4,699,849 | 10/1987 | Das | 428/389 |
| 4,717,589 | 1/1988 | Ishikawa et al. | 427/57 |
| 4,732,779 | 3/1988 | Towata et al. | 427/57 |
| 4,735,856 | 4/1988 | Schultz et al. | 428/379 |
| 4,792,487 | 12/1988 | Taylor et al. | 428/379 |
| 4,822,679 | 4/1989 | Cerdan-Diaz et al. | 428/389 |
| 4,855,262 | 8/1989 | Richon et al. | 428/378 |
| 4,859,503 | 8/1989 | Bouix et al. | 427/249 |
| 4,877,643 | 10/1989 | Ishikawa et al. | 427/57 |
| 4,933,309 | 6/1990 | Luthra | 501/95 |
| 4,971,673 | 11/1990 | Weisweiler et al. | 204/192.15 |

FOREIGN PATENT DOCUMENTS

| | | |
|---|---|---|
| 3706218 | of 0000 | Germany . |
| 2136405 | 3/1972 | Germany . |
| 60-221169 | 11/1985 | Japan . |
| 2-125853 | 5/1990 | Japan . |
| 1237532 | 6/1971 | United Kingdom . |

OTHER PUBLICATIONS

Gilmore et al., Pulsed Metallic Plasma Generators, "Proceedings of the IEEE", V. 60, No. 8, pp. 977–991.

Primary Examiner—Ngoclan T. Mai
Attorney, Agent, or Firm—Gary L. Griswold; Walter N. Kirn; Carole Truesdale

[57] ABSTRACT

A coated fiber is provided. The coated fiber comprises a ceramic or carbon fiber having a coating thereon of a refractory metal or metal-based ceramic material, the coating being substantially uniform and having a morphology which is fully dense and substantially void free. Further provided is a process for coating ceramic or carbon fibers in continuous tows or bundles comprising (a) applying sufficient current to a metal cathode to form a plasma of atoms and ions of the cathode material, (b) positioning said fibers in the path of said plasma, said plasma causing said fibers to billow, and (c) causing said plasma to condense on said fibers to form a refractory metal or a metal-based ceramic coating.

13 Claims, 5 Drawing Sheets

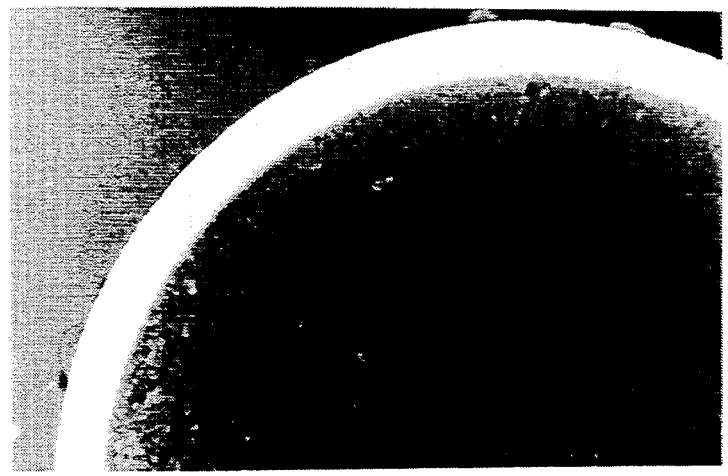
Fig. 3
Fig. 4

Fig. 5
Fig. 6
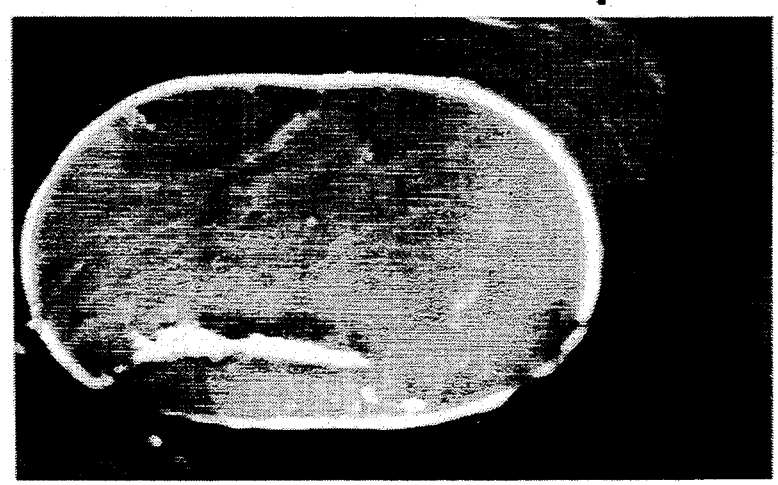

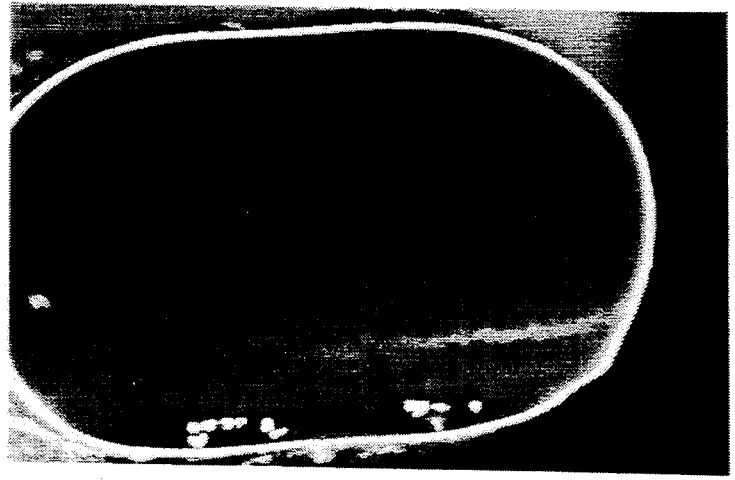
Fig. 7
Fig. 8

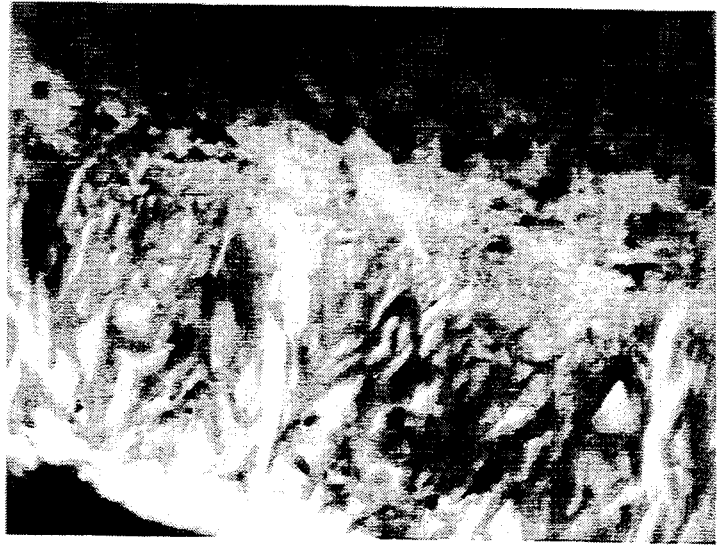
Fig. 9
Fig. 10

COATED FIBERS

This invention relates to ceramic or carbon fibers coated with refractory metals or metal-based ceramics and a method of producing the coated fibers.

High performance fibers are increasingly being used as reinforcement for plastic, metal, ceramic, and carbon matrix composites. The role of the fibers in a composite is to add strength and to increase the elastic modulus. The degree of toughness attained is greatly affected by the bond between the fibers and the matrix. If brittle reaction products are formed in the region between the fibers and the matrix, mechanical properties often suffer.

The most demanding of these applications are those involving high fabrication and operating temperatures. In such cases the matrix is either a ceramic or metallic material. In order to fabricate metal matrix composites, for example, a consolidation process can be used. At high process temperatures (usually about 80% of the matrix material melting point) and high process pressures (usually in the region of 5 to 40 Kpsi, 34.5 MPa to 276 MPa), the matrix metal material is made to flow around the fibers, thus forming the composite article. At these high temperatures, deleterious fiber-matrix reactions may occur. In such environments, the matrix may chemically react with, or dissolve portions of the fiber. Although chemical reaction may in some cases be beneficial, it usually leads to reductions in strength and toughness. In many cases, these high temperature problems can be solved by applying barrier coatings on the fibers before they are embedded in the matrix.

One well-known method of applying such barrier coatings to fibers is by chemical vapor deposition (CVD). U.S. Pat. No. 4,343,836 (Newkirk et al.), for example, discloses long lengths of multifilamentary carbon, graphite, ceramic or metallic yarn coated with at least one refractory metal selected from tantalum, niobium, molybdenum, tungsten and rhenium. The fibers are coated by reacting a volatile halide of the coating metal with hydrogen in the presence of the yarn which is pulled continuously through a coating chamber at a temperature sufficiently high for the reaction to proceed but lower than about 1100° C. and at reduced pressure less than about 300 torr and separating the coated yarn from the gaseous reactants and gaseous reaction products before the coated yarn is allowed to cool.

U.S. Pat. No. 4,581,289 (Dietrich et al.) discloses a superconducting fiber bundle which comprises a multiplicity of carrier fibers coated with a superconducting layer of a niobium compound selected from niobium oxycarbonitride and niobium carbonitride of the general formula $NbC_xN_yO_z$ wherein $x+y+z$ is equal to or less than 1. The superconductive layer of a niobium compound is reported to have a fine-grained B1-structure with a mean grain size between 3 and 50 nm, a layer thickness between 100 and 2000 nms and occlusions of insulating material uniformly distributed between the B1-structure niobium compound grains. The coating of the fibers can be accomplished by a chemical process such as a currentless wet chemical process or CVD. When the fibers are to be coated by a physical process such as reactive cathode sputtering, the carrier fiber bundle must be fanned out into a carrier fiber ribbon where the fibers are substantially parallel and are disposed side by side in one plane.

German Patent Publication No. 3,706,218 (Weisweiler et al.) discloses coating of a multiplicity of individual fiber bundles with a thin surface-protecting and adhesion-promoting layer of silicon carbide or a plasma polymer. The deposition of the surface layer is accomplished by high frequency cathode atomizing or high frequency plasma polymerization. Carbon, silicon carbide, boron, steel, glass and polymeric fiber materials in up to several thousand single filaments are used as the substrate for the deposition. During coating, the individual filaments become charged which results in mutual repulsion of the filaments which permits application of a continuous coating of improved thickness homogeneity.

U.S. Pat. Nos. 3,625,848 and 3,836,451 (Snaper) disclose a cathodic arc deposition process and apparatus. The process comprises emitting a beam of particles consisting of atoms and ions of source material, each particle having a kinetic energy between about 10 and 100 electron volts. The particles are deposited onto an object to coat the object with a thin film of source material. A beam gun is provided having an anode and a cathode and is supplied with current of such magnitude as to cause an arc discharge to occur between the anode and cathode to emit the beam.

The present invention provides refractory metal or metal-based ceramic barrier/interphase coatings on ceramic or carbon fibers, the coatings being substantially uniform and having a morphology which is fine grained and substantially void free. The coatings are also very adherent and they are generally crystalline and also stoichiometric when reactive deposition techniques are used.

The present invention further provides a process for coating ceramic or carbon fibers in continuous tows or bundles comprising applying sufficient current to a metal cathode to form a plasma of atoms and ions of the cathode material, positioning said fibers in the path of said plasma, said plasma causing said fibers to billow, and causing said plasma to condense on said fibers to form a refractory metal or a metal-based ceramic coating.

BRIEF DESCRIPTION OF THE DRAWINGS

FIG. 3 is a scanning electron photomicrograph of a coated fiber of the present invention at 12,100× magnification.

FIG. 4 is a transmission electron photomicrograph of the coated fiber of FIG. 3 at 100,000× magnification.

FIG. 5 is a transmission electron photomicrograph of a coated fiber of the prior art prepared using radio frequency sputtering at 50,000× magnification.

FIG. 6 is a scanning electron photomicrograph of a coated fiber of the present invention at 6,000× magnification.

FIG. 7 is a scanning electron photomicrograph of a coated fiber of the present invention at 7,500× magnification.

FIG. 8 is a transmission electron photomicrograph of a coated fiber of the present invention at 100,000× magnification.

FIG. 9 is a transmission electron photomicrograph of a coated fiber of the prior art prepared using chemical vapor deposition at 50,000× magnification.

FIG. 10 is a scanning electron photomicrograph of a coated fiber of the present invention at 25,300× magnification.

Fibrous materials useful in the present invention include carbon, and ceramic fibers such as, for example, alumina, alumina-silica, alumina-boria-silica, boron, titanium diboride, tungsten, silicon carbide, silicon nitride, boron nitride and Inconel TM fibers. Particularly preferred fibers are alpha-alumina fibers and Nextel TM alumina-boria-silica continuous fibers, available from 3M Company. The fibrous material can be in the form of tow having a finite length or in continuous form, each tow containing from a few to many filaments. Generally, the fiber diameter is in the range of about 5 to 150 micrometers, more preferably 5 to 50 micrometers, most preferably 5 to 30 micrometers.

Refractory metals or metal-based ceramics useful as the barrier/interphase coatings in the present invention include, for example, molybdenum, tantalum, tungsten and niobium, oxides of aluminum, yttrium, zirconium, hafnium, gadolinium, titanium, erbium and other rare earth metals, and carbides of tantalum, tungsten, niobium, zirconium, hafnium and titanium. Preferably, the refractory metal or metal-based ceramic is applied to achieve a coating thickness of about 20 to 500 nanometers, more preferably about 50 to 300 nanometers.

Figure 1:
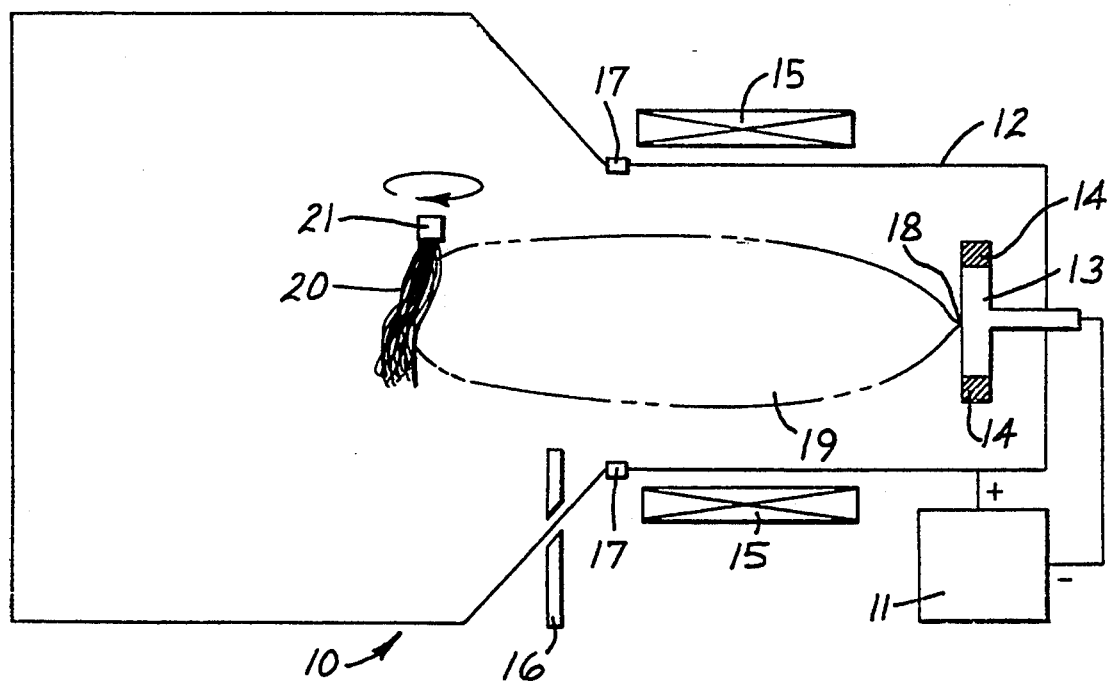
FIGS. 1 and 2 are cross-sectional side views of apparatus suitable for use in the present invention.

The coating can be applied to the fibrous material using cathodic arc deposition. An apparatus useful for such deposition in batch applications is shown in FIG. 1. Vacuum chamber 10 contains cathode 13 formed of conductive material with which the fiber is to be coated and surrounded by confinement ring 14. Anode 12 forms a portion of chamber 10. Current is supplied from high current power supply 11 to cause an arc discharge to occur between anode 12 and cathode 13 and plasma 19 to form from cathode 13. Plasma 19 is directed by magnetic solenoid 15 and deposits on rotating fiber tow 20 held in chuck 21. Insulating ring 17 separates anode 12 from that portion of vacuum chamber 10 in which the fiber tow is suspended. Optionally, a reactive gas and/or an inert gas can be fed through tube 16.

Figure 2:
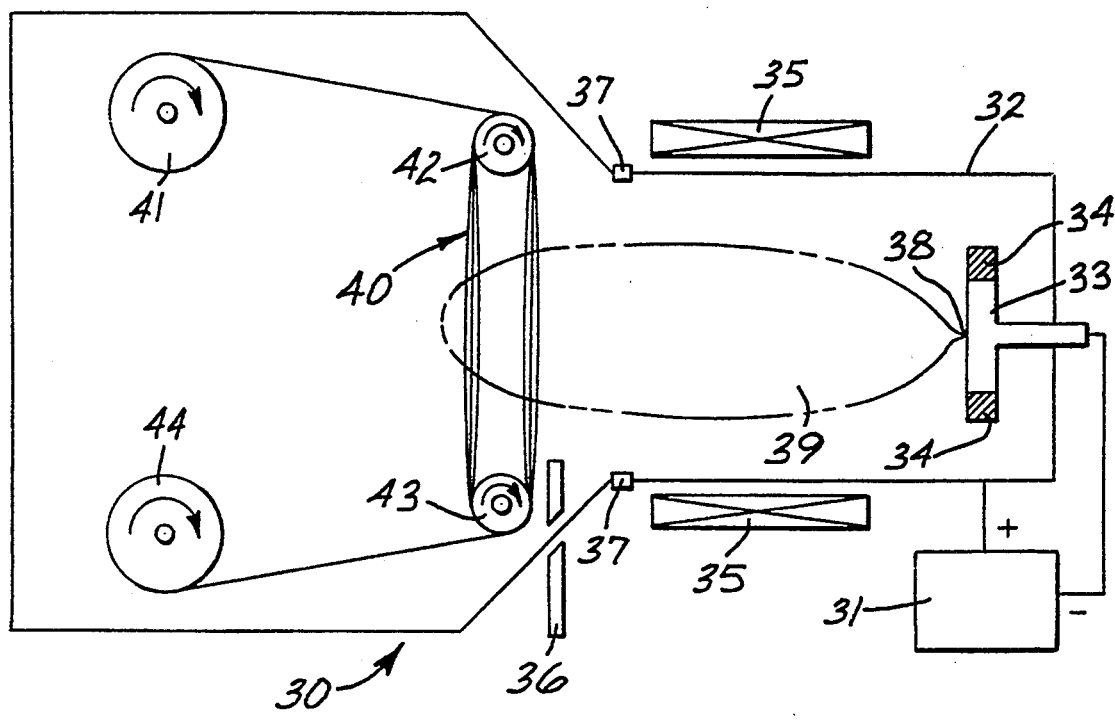

Another apparatus useful for such deposition but for continuous operation is shown in FIG. 2. Vacuum chamber 30 contains cathode 33 formed of conductive material with which the fiber is to be coated and held within confinement ring 34. Anode 32 forms a portion of chamber 30. Current is supplied from high current power supply 31 to cause an arc discharge to occur between anode 32 and cathode 33 and plasma 39 to form from cathode 33. Plasma 39 is directed by magnetic solenoid 35 and deposits on continuous fibers 40 which are fed from spool 41 over festooning rolls 42 and 43 and onto takeup spool 44. Insulating ring 37 separates anode 32 from that portion of vacuum chamber 30 in which the fiber tow is festooned. Optionally, a reactive gas and or an inert gas can be fed through tube 36.

The inert gases which can be used in the present invention include argon, krypton, xenon, helium and other gases belonging to Group 8 of the periodic table which are chemically inert in a plasma environment. The use of such gases generally aids in the development of a more stable discharge from the cathode. Argon is generally preferred due to cost and availability.

Reactive gases which are useful in the present invention include oxygen, nitrogen, ammonia, hydrocarbons and boron-containing gases such as diborane and borazine.

When the conductive material of the cathode is connected to the high current power supply, arcs form on the cathode surface. The arcs formed are small, luminous regions which are very mobile and move rapidly over the cathode surface. Due to the high current density contained in each spot, rapid ebullition of the cathode material occurs forming a plasma of atoms and ions of the cathode material and this material is deposited on the fibers. The current density at each spot may reach ten million amperes per square centimeter and this leads to the ionization of much of the outflowing vapor.

The high activation energy and fluence of the ions in the cathodic arc plasma permits control of the morphology of the deposition and the ability to form very dense coatings. The coatings are small grained and columnar in structure, with grain size preferably in the range of about 5 to 75 nm, more preferably 15 to 25 nm. The coatings are fully dense, i.e., without substantial voids either within or between the columns. Without substantial voids as used herein means one visible void per 0.5 square micrometer of area, particularly when viewed in a transmission electron photomicrograph at 200,000 magnification. A visible void is generally about 5 nm or greater in size.

The high activation energy and fluence of the ions also causes the fiber tow to billow out and the fibers separate from each other, permitting the deposition of substantially uniform coatings, i.e., having less than 80%, more preferably less than 50%, most preferably less than 30% deviation from the average both lengthwise and in cross section. Further, the fluctuating nature of the ion wind caused by the random nature of the arc motion on the cathode, results in a shaking of the fiber tow resulting in further separation of the individual fibers.

Excellent adhesion of the coatings to the fibrous material results from deposition by cathodic arc because the high energy ions in the plasma result in strong atom-to-atom bonding, with some interdiffusion of the coatings and the fibers. This excellent adhesion is evidenced by a lack of spalling away from the break line when a coated fiber is broken.

Reactive deposition of compounds is possible using cathodic arc with the simple addition of the reactive gas into the coating chamber. For example, the use of a yttrium cathode and a small amount of oxygen in the chamber results in a deposit of yttrium oxide. Thus, non-conductive materials can be deposited using cathodic arc. The compounds of reactive deposition are stoichiometric and generally crystalline, providing sufficient reactive gas is supplied to the system.

The coatings on the fibers of the present invention find use, for example, as protective layers for corrosion control or erosion control, as diffusion barriers, as wetting agents, and as interphase layers for controlled mechanical properties of composites prepared from these fibers.

Barrier coated fibrous materials of the invention have utility in toughening inorganic and organic matrices derived from metals, ceramics, glasses, carbon, and polymers. The barrier coatings can improve wetting of the fibrous materials by the matrix, establish a favorable bond strength between the fibrous materials and the matrix to further toughen the composite, prevent chemical reaction between fibrous materials and matrix, and prevent dissolution of the fibrous materials in the matrix.

The following nonlimiting examples are presented to further describe and illustrate the invention. In the examples the coated fibers were characterized using the following methods.

Transmission Electron Microscope (TEM) was used to determine the crystal and grain structure of the coatings and to show the presence of voids within the coatings. A number of short lengths of the coated fibers to be characterized were embedded in colloidal carbon glue from Ted Pella, Inc., of Redding, Calif., in the shape of a flat disc 0.118 inches (3 mm) in diameter. This disc was then thinned in a small area by a Gatan Model 600 dual ion mill, until a hole with thinned tapered edges was made in the fiber/carbon disc. A Jeol 200CX transmission electron microscope then imaged areas near the tapered edge, to find coated fiber showing both the fiber and the coating.

Scanning Electron Microscope (SEM) was used to determine the morphology of the coatings. Sample preparation for SEM analysis was dependent on the material coated.

When the fibrous material was alpha-alumina fibers, which are typically 8 to 30 micrometers in diameter, and of circular cross section, the following method was used. A 0.25 inch (0.64 cm) long section of the coated fiber tow, typically containing several thousand filaments, was fastened to a standard aluminum SEM stub with double sided adhesive tape. The ends of the filaments were left overhanging the edge of the stub. An additional 0.0625 inch (0.16 cm) was cut off the ends of the overhanging tow using a scissors. The stub and filaments were overcoated with 90 angstroms of gold-palladium and inserted into the SEM. A model JSM-35C SEM from JEOL of Tokyo, Japan, or a model 240 SEM from Cambridge Instruments Ltd. of Cambridge, England, was used to image the ends of the fibers and the applied coatings.

For carbon fibers or Nextel 480 fibers which are 5 to 12 micrometers in diameter, a different SEM technique was used. A 0.25 inch (0.64 cm) long section of coated multi-filament tow was potted into a 1 inch (2.54 cm) diameter by 0.5 inch (1.27 cm) long stub using Epo-Kwick epoxy from Buehler, Inc., of Lake Bluff, Ill. The surface of the so-embedded stub with its filament ends was polished with diamond abrasives down to a 0.5 micrometer grit size. The stub was then etched in a model MICRO-RIE barrel type oxygen plasma etcher from Technics of Dublin, Calif., for 15 minutes at 350 watts. The so-produced stub was then overcoated with 90 angstroms of gold-palladium and then viewed.

X-Ray Diffraction (XRD) was used to determine the crystalline phase of the coatings. A number of short lengths of coated fiber were crushed using a boron carbide mortar and pestle. The so-crushed fiber and coating was packed into a 0.25 mm diameter, 0.002 mm wall thickness, glass capillary. The packed capillary was mounted in a Debye-Scherrer powder camera from General Electric Co. and exposed to copper K-alpha X-rays from a model 3 X-ray source also from General Electric, operating at 40 kilovolts and 20 milliamperes for 1 hour as the diffracted X-ray pattern was imaged by photographic film. A vernier ruler was used to measure the diffraction line positions and a comparison was made with published powder X-ray diffraction patterns to obtain lattice constants and phase identities.

Optical Microscopy (OM) was used to qualitatively determine coating quality on transparent fiber. By immersing the coated fibers in an oil which has a matching optical index of refraction with the fiber, and then observing the oil soaked fibers using cross-polarized light, under an optical microscope at 1100× power, the encased fibers are rendered nearly invisible, and the coatings show up as two parallel lines. Using this technique one can observe the uniformity of the coating along the length of the fibers. The fibers are rendered invisible with this technique but the coating has an unmatched refractive index and is clearly visible as two bright lines. Coating uniformity along the fiber is determined from observation of the width of the lines.

For Examples 1 and 8, alpha-alumina fibers were prepared as follows:

An aluminum formoacetate solution of composition $Al(OH)_{1.8}(O_2CCH_3)_{0.6}(O_2CH_3)_{0.6}$ was prepared by digesting aluminum powder in an acetic acid-formic acid solution under reflux conditions. A 1000 ml round bottom flask was charged with 516.8 g of deionized water, 44.6 ml of glacial acetic acid and 33.1 ml of concentrated formic acid. The solution was brought to a rolling boil and 34.9 g of aluminum metal powder was added to the boiling carboxylic acid mixture in 3 portions of roughly 12 g each over a 2 hour period. An exothermic reaction ensued after the initial addition, and the rate of the reaction was moderated by the occasional addition of room temperature deionized water. The digestion was continued for 10 hours, and the slightly hazy solution was cooled, filtered through a Whatman #54 and a Whatman #5 filter paper. The percent solids was determined by gravimetric analysis to be 9.25%.

An iron nitrate solution was prepared by dissolving 19.73 g $Fe(NO_3)_3.9H_2O$ in 800 mL deionized water. Then 9.40 g $NH_4HCO_3$ was dissolved in 150 g water and slowly added to the rapidly stirred iron nitrate solution over a period of 5 minutes. The solution was then stirred and heated (maximum temperature 80° C.) and dialyzed by passing deionized water through a dialysis tube which was immersed in the hydrolyzed iron solution. The heating was discontinued after 40 minutes but the dialysis was carried out overnight. The final dispersion was 0.39 weight percent equivalent iron.

A spinning sol was prepared by adding 13.3 g of the hydrous iron polymer solution and to 162 g of the aluminum formoacetate solution which was being rapidly stirred. To this 2.5 g of an 85% lactic acid solution was added. Whale maintaining rapid stirring, 0.52 g of Nalco ™ 2326 colloidal silica (50 angstrom particle size, ammonium ion stabilized, 14.5% $SiO_2$, available from Nalco Chemical Company) was added. A final addition of 0.09 g $Mg(NO_3)_2.6H_2O$ dissolved in 20 g water was added dropwise to give a nominal oxide composition $Al_2O_3$+0.35% equivalent iron+0.5% $SiO_2$+0.1% MgO.

Fibers were spun, collected and heated to 650° C. in air at a heating rate of 150° C. per hour. The prefired fibers were then rapidly heated to 1400° C. in air in a CM ™ Rapid Temp Furnace (CM, Inc., Bloomfield, N.J.) and held at this temperature for 10 minutes to convert them to alpha-alumina.

EXAMPLE 1

An alpha-alumina fiber tow, 4 inches (10.2 cm) long, containing about 5000 fibers, each fiber being about 16 to 30 micrometers in diameter, was fastened without tension, to a 45 RPM rotating clamp. The clamp was positioned in a Model 1000 boron nitride confined type cathodic arc apparatus, from Metco Cat Arc division of Perkin Elmer Corp. and shown in FIG. 1 and similar to that described in U.S. Pat. No. 3,836,451 (Snaper) and having a magnetic solenoid as described in Gilmore et al., "Pulsed Metallic-Plasma Generators," *Proceeding of the IEEE*, V. 60, No. 8, pp. 977–991, is incorporated herein by reference, such that the fiber tow was 10 inches (25.4 cm) from the cathode. A 2.25 inch (5.7 cm) diameter, 1 inch (2.54 cm) thick yttrium cathode from Research Chemicals, Inc., Phoenix, Ariz. was mounted on a water cooled cathode holder, which was installed in a cryopumped vacuum chamber of the apparatus. After the vacuum chamber was evacuated to $2 \times 10^{-6}$ torr, the high vacuum pump was throttled, and a mixture of argon at a flow rate of 15 sccm and oxygen at a flow rate of 55 sccm was admitted to the chamber. The chamber pressure was 11.6 mTorr. An arc was ignited on the cathode surface and was regulated to 150 amperes at 50 volts. A 6 inch (15.2 cm) long solenoid providing a magnetic field of 50 Gauss, served to duct the yttrium plasma to the fiber tow. During the plasma deposition, the tow of fibers was observed to billow apart, allowing each individual fiber to be coated. The total deposition time, from arc ignition to arc extinction was 5 minutes.

The SEM photomicrograph of this fiber shown in FIG. 3 demonstrates that the coating has fine columnar structure and substantially uniform thickness. Further examination by SEM revealed that all the fibers in the tow were coated to a thickness of 150 nm with a variation of 50 nm.

The TEM photomicrograph of this alpha-alumina fiber shown in FIG. 4 shows the coating to have a fine columnar microstructured yttrium oxide coating, which was completely void free. The columns had a width of 15 nm and appeared to be tightly packed with no voids.

OM revealed the fibers to be uniformly coated lengthwise to a coating thickness of 150 nm with a variation of 50 nm.

XRD analysis of the fibers showed that the only phase present in the coating was cubic yttrium oxide.

Comparative Example 1A

Radio frequency (RF) sputtering was used to deposit yttrium oxide onto the same alpha-alumina fibers as in Example 1. A 4 inch (10.2 cm) diameter, 99.9 percent yttrium oxide cathode from Cerac, Inc., Milwaukee, Wis., was mounted in a cryopumped Perkin Elmer Randex sputtering system. 500 watts of RF power at 13.56 MHz was applied to the cathode with a Linde UHP Specialty mix argon plus 10 percent oxygen gas ambient, and the chamber pressure held at 10 mTorr. The fibers were mounted parallel to each other in a small metal frame at a distance of 7.5 cm from the cathode surface, and the sputtering allowed to take place for 150 minutes. The chamber was then vented and the frame turned 180 degrees to the cathode. The chamber conditions were re-established as before, and the sputtering continued for 130 minutes.

The TEM photomicrograph of FIG. 5 shows the coating to have a coarse microstructure with a yttrium oxide grain size of 500 angstrom and many voids of 5 nm or larger in size between the grains extending throughout the coating structure.

XRD analysis of the fibers showed that the coating was a mixture of amorphous and cubic yttrium oxide.

EXAMPLE 2

Using a cathodic arc apparatus as shown in FIG. 2, a continuous fiber tow, containing about 780 filaments of Nextel TM 480, available from 3M Co., St. Paul, Minn., was coated. A plasma was produced as in Example 1 except the vapor was generated from a zirconium cathode from Phoenix Metallurgical, Inc. of Houston, Tex., the arc current was 150 amperes, the argon gas flow was 37 sccm the oxygen gas flow was 44 sccm and the chamber pressure was 30 /mTorr. The tow was wrapped around festooning rollers, each 1 inch (2.54 cm) in diameter, which were 8 inches (20.3 cm) apart, center to center. The tow thus made seven passes through the ionizing vapor, for an average residence time in the vapor of 0.5 minutes. During the plasma deposition, the tow of fibers was observed to billow apart, allowing each individual fiber to be coated.

OM revealed the fibers to be uniformly coated lengthwise.

SEM analysis of the fibers showed all the fibers in the tow to be coated to a thickness of 150 nm with a variation of 70 nm, and a microstructure of fine columns with no voids between them. By fine column is meant columns of 150 to 200 angstroms in diameter. The SEM photomicrograph in FIG. 6 shows the dense, uniform zirconium oxide coating on the fiber. The irregularities on the lower portion of the fiber are believed to be an artifact of stub preparation.

EXAMPLE 3

Nextel TM 480 fibers were coated with zirconium oxide using the procedure set forth in Example 2 except the arc current was 150 amperes, the argon gas flow was 40 sccm, the oxygen flow was 44 sccm the chamber pressure was 24 mTorr and the coating time was one minute.

OM revealed the fibers to be uniformly coated lengthwise. The SEM photomicrograph in FIG. 7 shows the fibers to be coated to a thickness of 100 nm with a variation of 50 nm and a microstructure of fine columns with no voids between them. Further SEM analysis showed all the fibers in the tow to be coated the same as the fiber shown in FIG. 7. A TEM showed a dense, uniform zirconium oxide coating on the fiber.

EXAMPLE 4

Nextel TM 480 fibers were coated as in Example 2 except a commercial grade hafnium cathode from Phoenix Metallurgical was substituted for the zirconium cathode, the argon gas flow was 43 sccm, the oxygen flow was 45 sccm, the chamber pressure was 28 mTorr and the coating time was one minute, to produce a dense coating of HfO2 on the Nextel 480 fibers.

OM revealed the fibers to be uniformly coated lengthwise. SEM analysis of the fibers showed all the fibers in the tow to be coated to a thickness of 100 nm with a variation of 50 nm, and a microstructure of fine columns with no voids between them.

EXAMPLE 5

Nextel TM 480 fibers were coated as in Example 2 except a 99.9% pure titanium cathode from Industrial Titanium Corp. of Northbrook, Ill. was substituted for the zirconium cathode, the arc current was 150 amperes, no argon gas flow was used, nitrogen replaced oxygen as the reactive gas at a flow rate of 44 sccm, the chamber pressure was 11 and the coating time was 1 minute, to produce a TiN coating on the fibers.

As can be seen from the TEM photomicrograph of FIG. 8, the fiber had a fine columnar microstructured titanium nitride coating which was completely void free. The columns had a width of 150 angstroms, and appeared to be tightly packed with no voids. SEM analysis of the fibers showed all the fibers in the tow to be coated to a thickness of 300 nm with a variation of 150 nm, and a microstructure of fine columns with no voids between them. XRD analysis of the fibers showed that the coating had a cubic crystalline structure.

Comparative Example 5A

TiN was coated on Nextel ™ 480 fibers using CVD as follows. Nextel 480 fibers were pulled through a 12 inch (30.5 cm) long tube furnace at 550° C. The reactants to the furnace were titanium tetrachloride at 32 sccm and nitrogen at 1200 sccm, with a hydrogen gas carrier at 3200 sccm.

As can be observed in the TEM photomicrograph of FIG. 9, the fibers had an equiaxed structure consisting of many voids 5 nm or larger in size between acicular grains. SEM analysis of the fibers showed the coating to have a void-filled fluffy microstructure. XRD analysis of the fibers showed tetragonal titanium nitride as the coating.

EXAMPLE 6

Nextel ™ 480 fibers were coated as in Example 2 except a 99.9% pure aluminum cathode was used instead of the zirconium cathode, the arc current was 50 amperes, the argon gas flow was 2 sccm, the oxygen gas flow was 30 sccm, the chamber pressure was 10 mTorr and the coating time was 2 minutes, to produce a dense coating of Al2O3 on the Nextel ™ 480 fibers.

OM revealed the fibers to be uniformly coated lengthwise. SEM analysis of the fibers showed all the fibers in the tow to be coated to a thickness of 100 nm with a variation of 50 nm, and a microstructure of fine columns with no voids between them.

EXAMPLE 7

Carbon fibers (Thornel ™ 3K type T300, available from Amoco Performance Products, Greenvile, S.C. 10.2 cm in length and 7 micrometers in diameter were coated using the procedure of Example 1 except a 99.9% pure aluminum cathode was used instead of the yttrium cathode, the arc current was 50 amperes, the argon flow was 2 sccm, the oxygen flow was 30.1 sccm, the chamber pressure was 7.4 mTorr and the coating time was four minutes to produce a dense coating of Al2O3 on carbon fibers.

SEM analysis of the fibers showed all the fibers in the tow to be coated to a thickness of 200 nm with a variation of 100 nm, and a microstructure of fine columns with no voids between them.

EXAMPLE 8

Alumina fibers of the type used in Example 1 were coated as in Example 1 except a 99.9% pure cathode of gadolinium from Research Chemicals, Inc. was used, the arc current was 50 amperes, the argon gas flow was 2 sccm, the oxygen flow was 30.1 sccm, the chamber pressure was 11 mTorr and the coating time was two minutes to produce a dense coating of cubic gadolinium oxide on the alumina fibers.

SEM analysis of the fibers showed all the fibers in the tow to be coated to a thickness of 500 nm with a variation of 200 nm, and a microstructure of fine columns with no voids between them. XRD analysis of the fibers showed a coating of cubic gadolinium oxide.

EXAMPLE 9

Nextel ™ 480 fibers were coated as in Example 2 using a commercial grade zirconium cathode from Phoenix Metallurgical, an arc current of 150 amperes, no argon feed, methane as the reactive gas instead of oxygen at a flow rate of 58.5 sccm, a chamber pressure of 16 mTorr and a coating time of two minutes to produce a dense coating of ZrC on the Nextel ™ 480 fibers.

SEM analysis of the fibers showed all the fibers in the tow to be coated to a thickness of 100 nm with a variation of 50 nm, and a microstructure of fine columns with no voids between them. XRD analysis of the fibers showed a zirconium carbide coating.

EXAMPLE 10

Nextel ™ 480 fibers were coated as in Example 2 except a 99.9% pure molybdenum cathode was used, the argon flow rate was 15 sccm, no reactive gas was fed to the chamber, the chamber pressure was 10 mTorr and the coating time was two minutes to produce dense coatings of Mo on the Nextel ™ 480 fibers.

SEM analysis of the fibers showed all the fibers in the tow to be coated to a thickness of 100 nm with a variation of 50 nm, and a microstructure of fine columns with no voids between them.

EXAMPLE 11

Carbon fibers (Thornel 3K type T300) were coated using the procedure of Example 1 except a 99.9% pure molybdenum cathode was used, the arc current was 150 amperes, the argon flow rate was 15 sccm, no oxygen feed was used, the chamber pressure was 9.8 mTorr and the coating time was four minutes to produce a dense coating of Mo on carbon fibers.

As can be seen in the SEM photomicrograph in FIG. 10, the coating had a microstructure of fine columns with no voids between them. Further SEM analysis of the fibers showed all the fibers in the tow to be coated to a thickness of 100 nm with a variation of 50 nm.

EXAMPLE 12

Nextel ™ 480 fibers were coated as in Example 2 except a 99.9% pure tantalum cathode was used, the arc current was 150 amperes, the argon gas flow was 15 sccm, no oxygen feed was used, the chamber pressure was 9.8 mTorr and the coating time was two minutes to produce dense coatings of Ta on the Nextel ™ 480 fibers.

SEM analysis of the fibers showed all the fibers in the tow to be coated to a thickness of 100 nm with a variation of 50 nm, and a microstructure of fine columns with no voids between them.

EXAMPLE 13

Carbon fibers (Thornel ™ 3K type T300) were coated as in Example 1 except a 99.9% pure tantalum cathode was used, the arc current was 150 amperes, the argon gas flow was 15.1, no oxygen feed was used, the chamber pressure was 9.8 and the coating time was four minutes to produce dense coatings of Ta on the carbon fibers.

SEM analysis of the fibers showed all the fibers in the tow to be coated to a thickness of 100 nm with a variation of 50 nm, and a microstructure of fine columns with no voids between them.

What is claimed is:

1. A coated fiber comprising a ceramic, carbon or metal fiber having a coating thereon of a refractory metal or metal-based ceramic material, the coating being substantially uniform and having a morphology which is fine grained and has one or less visible void per 0.5 square micrometer of area, a visible void being 5 nanometers or greater in size.

2. The coated fiber of claim 1 wherein said metal fiber is tungsten or Inconel.

3. The coated fiber of claim 1 wherein said fiber is alpha alumina, alumina-silica, alumina-boria-silica, boron, titanium diboride, silicon carbide, silicon nitride or boron nitride.

4. The coated fiber of claim 3 wherein said fiber is alpha-alumina or alumina-boria-silica.

5. The coated fiber of claim 1 wherein said fiber is about 5 to 150 micrometers in diameter.

6. The coated fiber of claim 1 wherein said fiber is 5 to 50 micrometers in diameter.

7. A coated fiber comprising a ceramic, carbon or metal fiber having a coating thereon of a refractory metal or metal-based ceramic material selected form the group consisting of molybdenum, tantalum, tungsten, and niobium; an oxide of aluminum, titanium, zirconium, hafnium, yttrium, gadolinium, erbium, and another rare earth metal, and a carbide of tantalum, tungsten, niobium, zirconium, hafnium and titanium, the coating being substantially uniform and having a morphology which is fine grained and has one or less visible void per 0.5 square micrometer of area, a visible void being 5 nanometers or greater in size.

8. The coated fiber of claim 1 wherein said coating has a thickness of about 20 to 500 nanometers.

9. The coated fiber of claim 1 wherein said coating has a thickness of about 50 to 300 nanometers.

10. A coated fiber comprising a ceramic, carbon or metal fiber having a coating thereon of a refractory metal or metal-based ceramic material, the coating being substantially uniform and having a morphology which has a grain size of about 5 to 75 nanometers and is substantially void free.

11. The coated fiber of claim 10 wherein said coating has a grain size of about 15 to 25 nanometers.

12. A coated fiber comprising an alpha-alumina fiber having a yttrium oxide coating thereon, the coating being substantially uniform and having a morphology which is fine grained and has one or less visible void per 0.5 square micrometer of area, a visible void being 5 nanometers or greater in size.

13. A coated fiber comprising an alpha-alumina fiber having a hafnium oxide coating thereon, the coating being substantially uniform and having a morphology which is fine grained and substantially void free.

* * * * *